(12) United States Patent
Ando et al.

(10) Patent No.: US 10,361,093 B2
(45) Date of Patent: Jul. 23, 2019

(54) MULTI TIME PROGRAMMABLE MEMORIES USING LOCAL IMPLANTATION IN HIGH-K/ METAL GATE TECHNOLOGIES

(71) Applicant: INTERNATIONAL BUSINESS MACHINES CORPORATION, Armonk, NY (US)

(72) Inventors: Takashi Ando, Tuckahoe, NY (US); Eduard A. Cartier, New York, NY (US); Chandrasekharan Kothandaraman, New York, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 16 days.

(21) Appl. No.: 15/647,590

(22) Filed: Jul. 12, 2017

(65) Prior Publication Data

US 2017/0358588 A1    Dec. 14, 2017

Related U.S. Application Data

(62) Division of application No. 15/176,982, filed on Jun. 8, 2016, now Pat. No. 10,211,064.

(51) Int. Cl.
| | |
|---|---|
| *H01L 27/11521* | (2017.01) |
| *H01L 29/788* | (2006.01) |
| *H01L 21/3115* | (2006.01) |
| *H01L 29/49* | (2006.01) |
| *H01L 29/51* | (2006.01) |
| *H01L 21/8234* | (2006.01) |

(Continued)

(52) U.S. Cl.
CPC .. *H01L 21/31155* (2013.01); *H01L 21/28282* (2013.01); *H01L 21/823462* (2013.01); *H01L 29/4966* (2013.01); *H01L 29/517* (2013.01); *H01L 29/66833* (2013.01); *H01L 29/792* (2013.01); *G11C 16/0466* (2013.01); *H01L 27/11568* (2013.01)

(58) Field of Classification Search
CPC ... H01L 27/11521; H01L 29/51; H01L 29/49; H01L 29/788; H01L 21/3115; H01L 21/28; H01L 29/66; H01L 29/43
See application file for complete search history.

(56) References Cited

U.S. PATENT DOCUMENTS

| | | | |
|---|---|---|---|
| 7,542,342 | B2 | 6/2009 | Kalnitsky et al. |
| 7,880,238 | B2 | 2/2011 | Liang et al. |
| | | (Continued) | |

OTHER PUBLICATIONS

List of IBM Patents or Patent Applications Treated as Related dated Apr. 11, 2018, 2 pages.

(Continued)

*Primary Examiner* — Marc Anthony Armand
*Assistant Examiner* — Quinton A Brasfield
(74) *Attorney, Agent, or Firm* — Tutunjian & Bitetto, P.C.; Vazken Alexanian

(57) ABSTRACT

A metal oxide semiconductor field effect transistors (MOSFET) memory array, including a complementary metal oxide semiconductor (CMOS) cell including an n-type MOSFET having a modified gate dielectric; and an n-type or p-type MOSFET having an unmodified gate dielectric layer, where the modified gate dielectric layer incorporates an oxygen scavenging species.

20 Claims, 6 Drawing Sheets

(51) Int. Cl.
*H01L 21/28* (2006.01)
*H01L 29/66* (2006.01)
*H01L 29/792* (2006.01)
*G11C 16/04* (2006.01)
*H01L 27/11568* (2017.01)

(56) References Cited

U.S. PATENT DOCUMENTS

| | | |
|---|---|---|
| 7,995,380 B2 | 8/2011 | Liu |
| 8,546,868 B2 | 10/2013 | Nakasaki et al. |
| 8,786,005 B2 | 7/2014 | Basceri et al. |
| 8,957,399 B2 | 2/2015 | Wei et al. |
| 9,171,954 B2 | 10/2015 | Cartier et al. |
| 2006/0268641 A1* | 11/2006 | Harris .................... G11C 17/14 365/207 |
| 2014/0103280 A1 | 4/2014 | Chen et al. |
| 2014/0103338 A1 | 4/2014 | Yamazaki et al. |
| 2015/0138891 A1* | 5/2015 | Iyer .................. H01L 27/11568 365/185.18 |
| 2015/0243888 A1 | 8/2015 | Hopstaken et al. |
| 2015/0349130 A1 | 12/2015 | Tanemura et al. |
| 2016/0005872 A1 | 1/2016 | Kurata et al. |
| 2017/0207316 A1* | 7/2017 | Hung ................ H01L 21/28088 |

OTHER PUBLICATIONS

List of IBM Patents or Patent Applications Treated as Related dated Jul. 12, 2017, 2 pages.

Kothandaraman, et al., "Oxygen Vacancy Traps in Hi-K/Metal Gate Technologies and Their Potential For Embedded Memory Applications", 2015 IEEE International Reliability Physics Symposium, Apr. 2015, pp. MY.2.1-MY2.4.

Liu, et al., "Improvement of Resistive Switching Properties in Zr02based Reram With Implanted Metal Ions", 2009 Proceedings of the European Solid State Device Research Conference, Sep. 2009, pp. 221-224.

* cited by examiner

MULTI TIME PROGRAMMABLE MEMORIES USING LOCAL IMPLANTATION IN HIGH-K/ METAL GATE TECHNOLOGIES

BACKGROUND

Technical Field

The present invention relates to improved multi-time programmable memories, and more particularly to ion beam modified gate dielectric of a field effect transistors (FET).

Description of the Related Art

Non-volatile memory typically retains stored information even after power to the memory device has been removed. Non-volatile memory may store information by maintaining an electric charge on an electronic (as opposed to magnetic or optical) device that includes material layers for trapping the electric charge. An example of electronic non-volatile memory is Flash memory. Flash memory may be NOR or NAND based. A characteristic of electronic non-volatile computer storage memory is that it can be electrically erased and reprogrammed. A multi-time programmable read only memory (MTPROM) may also be based on metal oxide semiconductor field effect transistors (MOSFETs) having a detectable difference in threshold voltage, $V_t$.

SUMMARY

A metal oxide semiconductor field effect transistors (MOSFET) memory array, including a complementary metal oxide semiconductor (CMOS) cell including an n-type MOSFET having a modified gate dielectric layer and an n-type or p-type MOSFET having an unmodified gate dielectric layer, where the modified gate dielectric layer incorporates an oxygen scavenging species.

A metal oxide semiconductor field effect transistors (MOSFET), including a substrate having a channel region, a gate stack including a gate dielectric layer, and a gate metal layer, wherein the gate dielectric layer includes an oxygen scavenging species that increases the number of oxygen vacancies in the gate dielectric layer.

A process of fabricating a metal oxide semiconductor field effect transistors (MOSFET) having a modified gate dielectric layer, including forming a source region, a drain region, and a channel region in a substrate, forming a gate dielectric layer on the channel region, forming a gate metal layer on the gate dielectric layer, and implanting an oxygen scavenging species into the charge trapping layer to increase the number of oxygen vacancies in the gate dielectric layer.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein.

DETAILED DESCRIPTION

Figure 1:
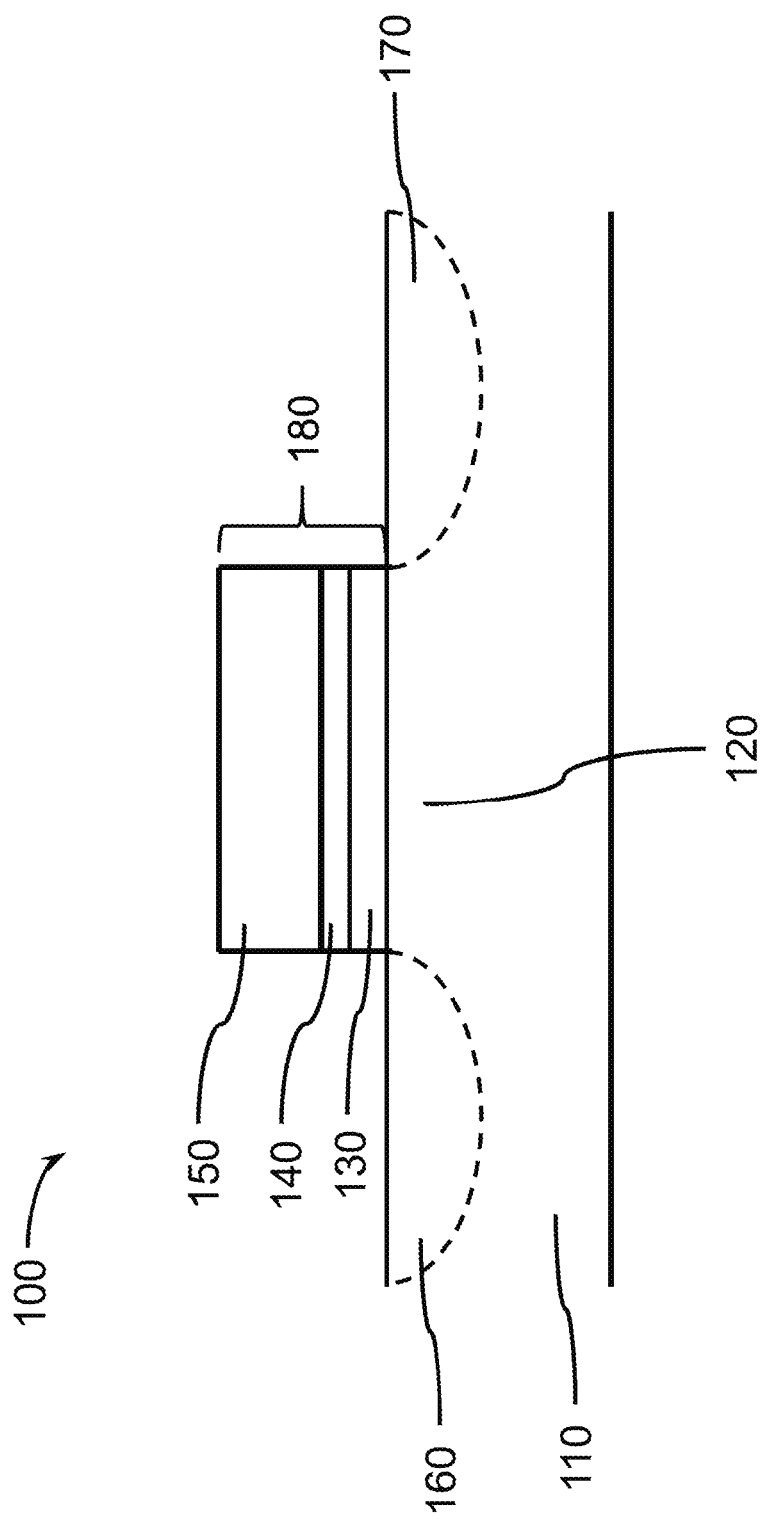
FIG. 1 is a cross-sectional view of a metal oxide semiconductor field effect transistors (MOSFET) device having a gate stack in accordance with an exemplary embodiment.

Principles and embodiments of the present disclosure related generally to improved multi-time programmable memories through control of vacancy traps to modify the electrical characteristics of a metal oxide semiconductor field effect transistors (MOSFET). The number and type of vacancies at a gate-channel interface may be controlled and/or adjusted by implantation of oxygen scavenging species, which can increase oxygen vacancies locally within the region of implantation. The gate dielectric layer may be part of a gate stack of a metal oxide semiconductor field effect transistors (MOSFET), where the MOSFET may be used to form a memory array.

It has been recognized that metal gate transistors with high-K gate dielectric layers have inherent fluctuations that can create variations in the threshold voltage, $V_t$, of a MOSFET device.

Principles and embodiments of the present disclosure relate to a method of fabrication and resulting devices that induces a threshold voltage shift, $\Delta V_t$, greater than the inherent fluctuations and variations in the threshold voltage, $V_t$. The threshold voltage shift, $\Delta V_t$, induced by the application of voltages on the selected device, may be enhanced by the implantation of oxygen scavenging species into the gate dielectric layer to alter the vacancy concentration at the device gate.

In one or more embodiments, the high-K metal oxide of a gate may be modified by ion beam implantation of an oxygen scavenging species to increase the density of oxygen vacancies in the region of implantation. The increase in oxygen vacancies may improve the charge trapping characteristics of the gate dielectric layer to provide an increase in threshold voltage when charged compared to an unmodified gate dielectric layer.

In various embodiments, implantation of an oxygen scavenging species may increase the concentration of oxygen vacancies in a high-K metal oxide forming the gate dielectric layer of an n-type FET (NFET). In various embodiments, the high-K metal oxide forming the gate dielectric layer may be hafnium oxide ($HfO_x$), where the stoichiometry of the oxide may affect the band structure of the gate, and threshold voltage ($V_t$) of the FET device.

In one or more embodiments, non-volatile memory may be fabricated from n-type MOSFETs (NFET) including a vacancy-modified high-k dielectric. The high-k gate dielectric layers of the NFETs may be selectively modified in-situ by ion bombardment with an oxygen scavenging species. Non-selected FETs in the non-volatile memory may be masked to prevent in-situ modification, for example, of the PFETs in the CMOS of the non-volatile memory.

In one or more embodiments, an NFET having a modified gate may be utilized in a memory element, where, during programming (e.g., applying suitable voltages to the gate), the increased oxygen vacancies in the high-K metal oxide may provide shifting of the threshold voltage to a higher voltage, which is greater than the threshold voltage fluctuations.

In various embodiments, a modified MOSFET may be used as one of the transistors in a CMOS cell memory array. The CMOS cell may include an NFET having a gate dielectric layer modified by incorporating an oxygen scavenging species and PFET having an unmodified gate dielectric layer. The MOSFET memory array may include a plurality of word lines, where the control gate of a MOSFET having a modified gate dielectric layer, and a control gate of the MOSFET having an unmodified gate dielectric layer forming the CMOS cell may be electrically connected to the same word line of the memory array.

Without being bound by theory, it is believed that carrier trapping by point defects in a high-K dielectric affects the threshold voltage of a MOSFET device. Metal oxides may form oxygen vacancies that may be trapping centers for free carriers (e.g., electrons, holes). The trap centers may also be distributed through the volume of the high-k metal oxide forming the gate dielectric layer, rather than just at an interface between the gate dielectric layer and the FET channel.

It is to be understood that the present invention will be described in terms of a given illustrative architecture; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present embodiments may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It ill be further understood that the terms "comprises," "comprising," "includes" and/or "including," used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower" "above," "upper," and the like, may be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device may be otherwise oriented (rotated 90 degrees or at other orientations), and the spatially relative descriptors used herein may be interpreted accordingly. In addition, will also be understood that when a layer is referred to as being "between" two layers, it can be the only layer between the two layers, or one or more intervening layers may also be present.

It will be understood that, although the terms first, second, etc. may be used herein to describe various elements, these elements should not be limited by these terms. These terms are only used to distinguish one element from another element. Thus, a first element discussed below could be termed a second element without departing from the scope of the present concept.

Referring now to the drawings in which like numerals represent the same or similar elements and initially to FIG. 1, which is a cross-sectional view of a MOSFET device having a gate stack in accordance with an exemplary embodiment.

In one or more embodiments, a metal oxide semiconductor transistor 100 may include a substrate 110, a source region 160 and a drain region 170, a channel region 120 in the substrate 110 between the source region 160 and drain region 170, and a gate stack, on at least the channel region 120. The gate stack may include a gate dielectric layer 130 on the channel region 120, a work function layer 140 on the gate dielectric layer 130, and a gate metal layer 150 on the work function layer 140. In various embodiments, the gate dielectric layer 130 may be formed of a high-k dielectric material. The gate dielectric layer 130 may be a charge-trapping layer that stores an electrical charge, and the gate metal layer 150 may control programming of the MOSFET device by charging and discharging of the gate dielectric layer 130.

In one or more embodiments, the channel region 120 may be part of a field effect transistor (FET), where the channel region 120 and substrate 110 may be an n-doped material or a p-doped material. A channel region 120 of a MOSFET may be part of an n-type enhancement mode FET.

In various embodiments, the substrate 110 may be a crystalline semiconductor, for example, silicon, silicon-germanium, germanium, a III-V compound semiconductor, or a II-VI compound semiconductor. In various embodiments, the substrate 110 may be a semiconductor-on-insulator (SeOI), a silicon-on-insulator (SOI), or a silicon-germanium-on-insulator (SiGeOI). In various embodiments, the substrate may be an insulator material with a silicon, silicon-germanium, germanium, a III-V compound semiconductor, or a II-VI compound semiconductor active layer on the insulator substrate. The substrate and/or active layer may be n-doped or p-doped.

In one or more embodiments, a gate dielectric layer 130 may be formed on the channel region 120 to form at least part of a gate stack of the FET 100. In various embodiments, the gate dielectric layer 130 may be a high-K dielectric material that may include, but is not limited to, metal oxides such as hafnium oxide (e.g., $HfO_2$), hafnium silicon oxide (e.g., $HfSiO_4$), hafnium silicon oxynitride ($Hf_wSi_xO_yN_z$), lanthanum oxide (e.g., $La_2O_3$), lanthanum aluminum oxide (e.g., $LaAlO_3$), zirconium oxide (e.g., $ZrO_2$), zirconium silicon oxide (e.g., $ZrSiO_4$), zirconium silicon oxynitride ($Zr_wSi_xO_yN_z$), tantalum oxide (e.g., $TaO_2$, $Ta_2O_5$), titanium oxide (e.g., $TiO_2$), barium strontium titanium oxide (e.g., $BaTiO_3$—$SrTiO_3$), barium titanium oxide (e.g., $BaTiO_3$), strontium titanium oxide (e.g., $SrTiO_3$), yttrium oxide (e.g., $Y_2O_3$), aluminum oxide (e.g., $Al_2O_3$), lead scandium tantalum oxide ($Pb(Sc_xTa_{1-x})O_3$), and lead zinc niobate (e.g., $PbZn_{1/3}Nb_{2/3}O_3$). The high-k material may further include dopants such as lanthanum and/or aluminum. The stoichiometry of the high-K compounds may vary.

In one or more embodiments, the gate dielectric layer 130 may have a thickness in the range of about 0.1 nm to about 10 nm, or about 1 nm to about 5 nm.

In various embodiments, the work function layer 140 may be a conductive nitride, including but not limited to titanium nitride (TiN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a carbide, including but not limited to titanium carbide (TiC), tantalum carbide (TaC), hafnium carbide (HfC), and combinations thereof. The stoichiometry of the high-K compounds may vary.

In one or more embodiments, the gate metal layer 150 may be a conductive material, for example, polycrystalline silicon, titanium nitride (TiN), a conductive metal (e.g., Cu, W, Al, Mo, etc.).

Figure 2:
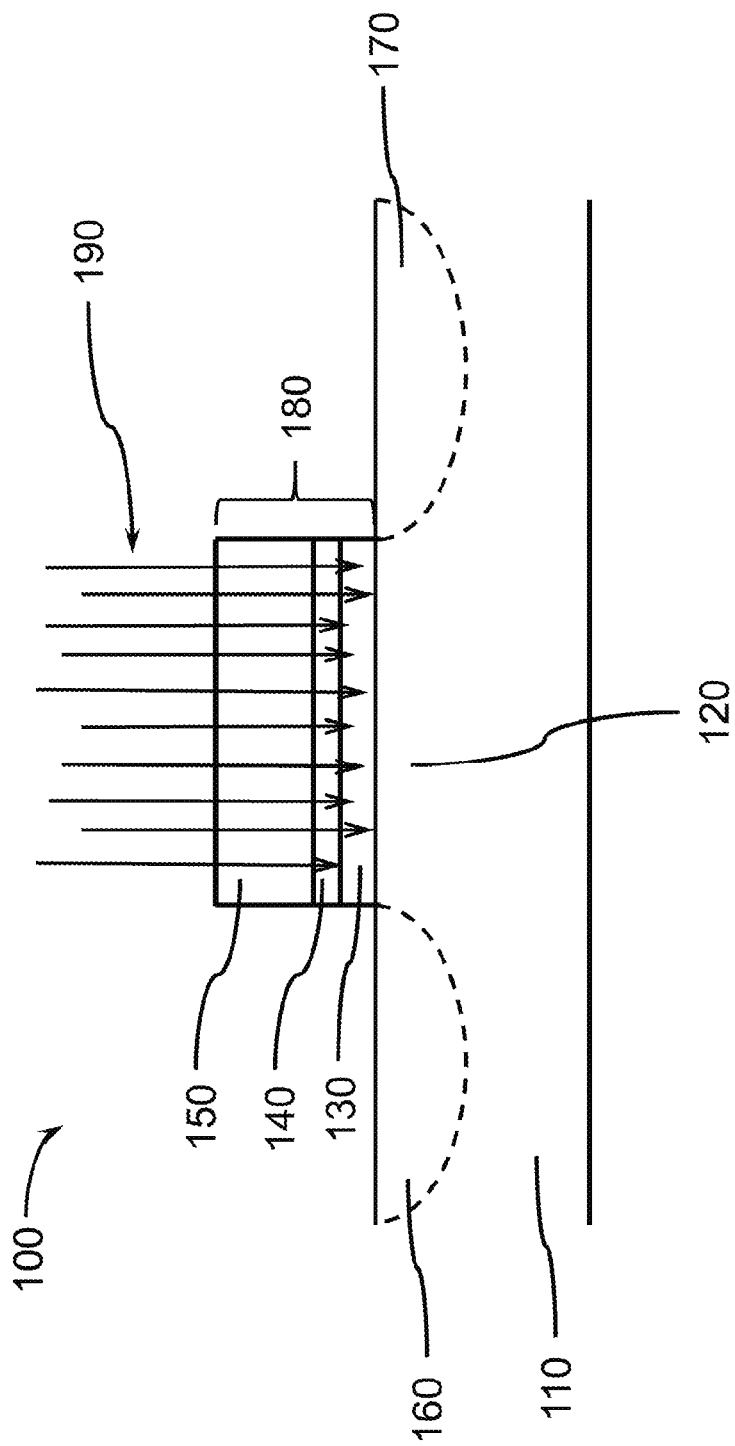
FIG. 2 is a cross-sectional view of a MOSFET device illustrating implantation of an oxygen scavenging species into a gate dielectric layer in accordance with an exemplary embodiment.

FIG. 2 is a cross-sectional view of a FET device illustrating implantation of an oxygen scavenging species into the gate stack in accordance with an exemplary embodiment.

In one or more embodiments, a gate dielectric layer 130 may be modified by implantation of an oxygen scavenging species that increases the number of charge trapping sites in the gate dielectric layer 130. The modification of a MOSFET may involve changing the number of charge carriers that may be trapped in the gate dielectric layer 130 during programming, where there may then be a change in the threshold voltage of the FET. Increasing the number of charge carriers that may be trapped can shift the threshold voltage to a higher voltage due to screening of the electric field in the channel region by the trapped charges.

In one or more embodiments, the oxygen scavenging species may be a metal that interacts with the metal of the metal oxide forming the floating gate of a FGFET, where the implanted metal may be the same or different from the metal forming the floating gate. In various embodiments, the oxygen scavenging species may be selected from the group consisting of aluminum, (Al), beryllium (Be), magnesium (Mg), calcium (Ca), strontium (Sr), barium (Ba), scandium (Sc), yttrium (Y), lanthanum (La), zirconium (Zr), hafnium (Hf), dysprosium (Dy), lutetium (Lu), erbium (Er), praseodymium (Pr), cesium (Ce), and combinations thereof.

In one or more embodiments, the energy of the ion beam may be selected to control the implantation depth of the oxygen scavenging species, so the implantation region is confined to the gate dielectric layer 130. In various embodiments, the implantation energy of the oxygen scavenging species may be in the range of about 1 KV to about 30 KV, where the energy may depend on the mass of the oxygen scavenging species and/or the intended implantation depth. In various embodiments, the total flux of oxygen scavenging species into the implantation region may be about $1 \times 10^{10}$ cm$^{-2}$ to about $1 \times 10^{12}$ cm$^{-2}$.

In various embodiments, a work function layer 140 may be formed on the gate dielectric layer 130 before implanting an oxygen scavenging species into the gate dielectric layer 130, where the ion implanted species 190 passes through the work function layer 140. In various embodiments, the gate metal layer 150 may be formed on the work function layer 140 before implanting an oxygen scavenging species 190 into the gate dielectric layer 130, wherein the oxygen scavenging species 190 may be implanted into the gate dielectric layer 130 through the work function layer 140 and/or the gate metal layer 150.

Figure 3:
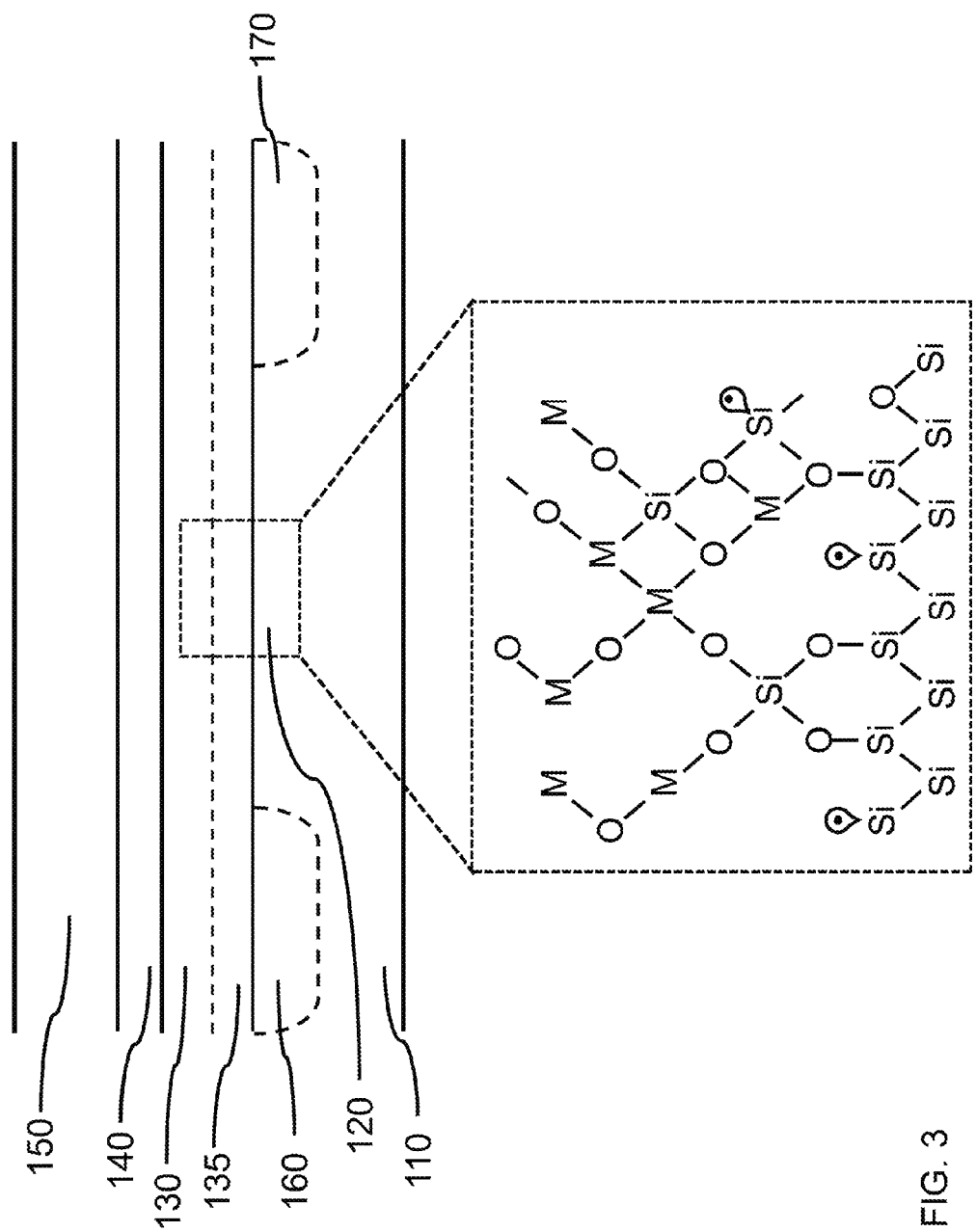
FIG. 3 is a close-up, cross-sectional view of a gate-channel interface in accordance with an exemplary embodiment.

FIG. 3 is a close-up, cross-sectional view of a gate-channel interface in accordance with an exemplary embodiment.

In one or more embodiments, an interfacial region 135 may be formed where the high-K metal oxide of the gate dielectric layer 130 meets the semiconductor material and any native oxide of the channel 120. Metal silicates may be formed in the interface region 135, which may include point defects. The point defects may be charge carrier traps, for example, electron traps or hole traps. In various embodiments, additional charge carrier traps may be formed by implanting a chemical species that increases the density of charge carrier traps within the gate dielectric layer 130 and/or interface 135. In various embodiments, the implanted species scavenges at least a portion of the oxygen present in the gate dielectric layer 130 and/or interface 135, which can result in the creation of point defects, for example, oxygen vacancies. These point defects can have a propensity to trap charge during programming, which can result in a change in the threshold voltage of the device, where such change in the threshold voltage can be permanent.

Unlike forming a gate by oxidizing the underlying substrate/channel material, forming a gate from a high-K metal oxide may introduce additional chemical species into the gate dielectric layer-channel region. In various embodiments, for example, forming a hafnium oxide ($HfO_2$) gate dielectric layer introduces at least hafnium metal, which may bind to oxygen and/or silicon forming hafnium silicide (e.g., HfS) and hafnium silicate (e.g., $HfSiO_4$) in an interface region between a silicon substrate and a hafnium oxide gate layer.

In one or more embodiments, a work function layer 140 may be formed on the high-K gate dielectric layer 130, where the work function material may be, for example, titanium nitride (TiN), titanium aluminum nitride (TiAlN), titanium silicon nitride (TiSiN), tantalum nitride (TaN), tantalum aluminum nitride (TaAlN), tantalum silicon nitride (TaSiN), or combinations thereof. The stoichiometry of the materials may vary.

In various embodiments, ion implantation of an oxygen scavenging species after formation of the work function layer may introduce additional chemical species into the gate dielectric layer 130 due to collision cascades, mixing, and enhanced diffusion. Thermal spikes, amorphization, and density variations may also be induced along the ion paths, where the damage mechanisms may depend on the mass of the implanted oxygen scavenger species. For example, barium (Ba), hafnium (Hf), lanthanum (La), cesium (Ce), praseodymium (Pr), erbium (Er), dysprosium (Dy), and lutetium (Lu) may induce heavy ion damage along the implantation path, depending on the ion dosage and implantation energies to generate charge trapping centers.

Figure 4:
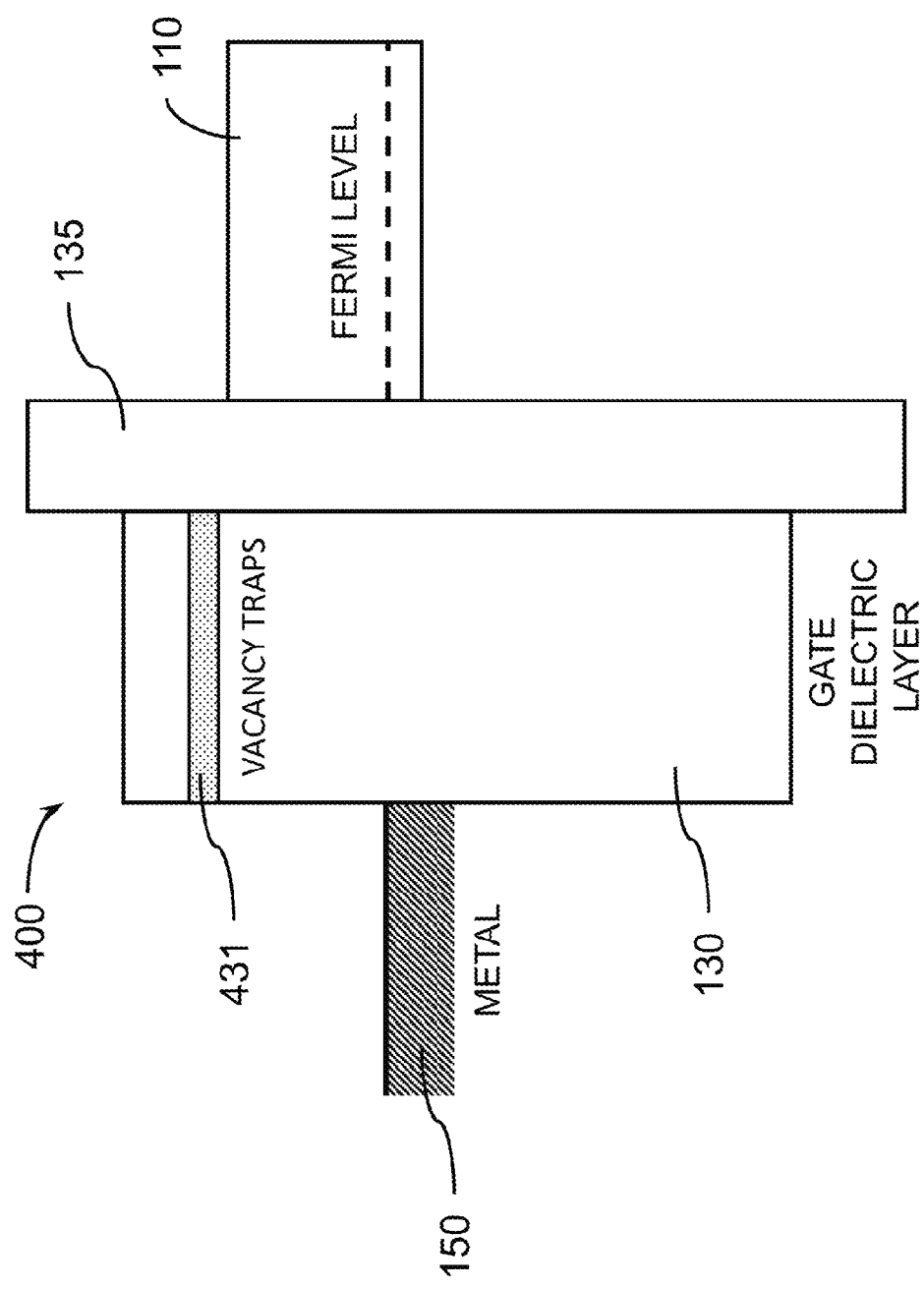
FIG. 4 is a diagram of the band structure for a MOSFET with a modified gate dielectric layer according to an exemplary embodiment.

FIG. 4 is a diagram of the band structure for a modified charge-trapping layer according to an exemplary embodiment.

The band-diagram is a representation of the gate metal layer 150, gate dielectric layer 130 with a band representing vacancy traps 431, interface region 135, and substrate 110 (e.g., p-type silicon) depicting the Fermi level. In one or more embodiments, implantation of an oxygen scavenging species into at least a portion of the gate dielectric layer 130 can generate charge traps (e.g., vacancy traps), wherein the energy of the charge traps may be at an energy above the energy of the metal conduction band, and above the fermi level of the semiconductor channel. The possible energy levels of the oxygen vacancies are represented as a 'band'. Charges may be promoted to the vacancy traps during programming by applying a voltage greater than 1 volt, or in the range of about 1.0 V to about 1.5 V, where the programming voltage may depend on the thickness of the dielectric and may be adjusted accordingly.

Figure 5:
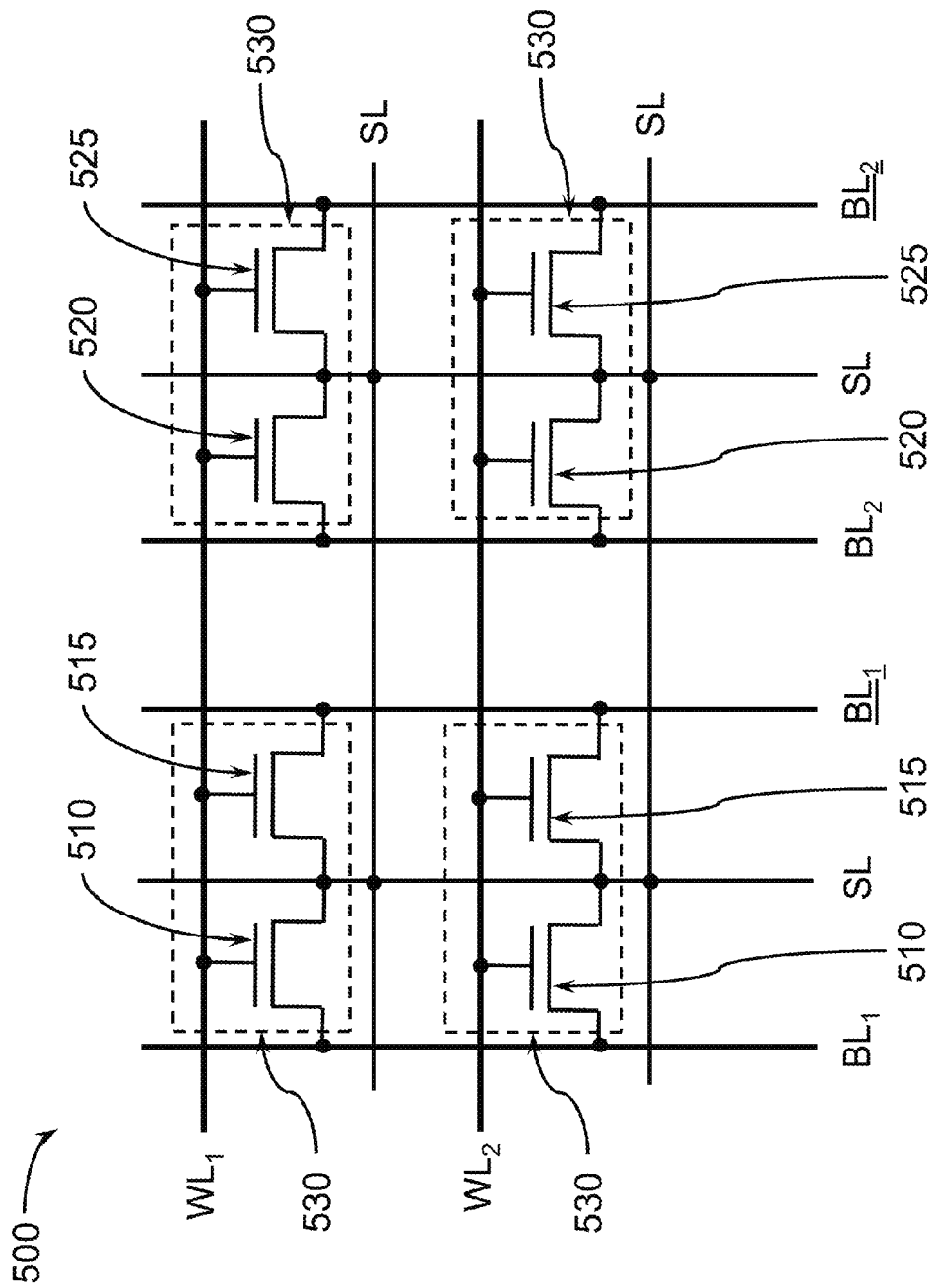
FIG. 5 is a diagram of a MOSFET memory array including n-type MOSFETS having modified gate dielectrics according to an exemplary embodiment.

FIG. 5 is a diagram of a MOSFET memory array according to an exemplary embodiment.

In one or more embodiments, a MOSFET memory array 500 including a plurality of modified MOSFETs 510, 520, and a plurality of unmodified MOSFETs 515, 525, arranged in twin memory cells 530. In various embodiments, a modified MOSFET 510 and a unmodified MOSFET 515 may form a twin memory cell 530. The MOSFET array 500 may be arrange in a matrix having a number of rows and a number of columns.

In various embodiments, the modified MOSFET 510 and the unmodified MOSFET 515 may be electrically connected to a word line, for example $WL_1$. A row of MOSFETs may be coupled to the same word line, where the word line is connected to the gate of each MOSFET in the same row. A voltage asserted on the word line, $WL_1$, activates the one or more memory cells at an address, and a voltage may be detected on bit lines, $BL_1$, $BL_2$, and on bit bar lines, $BL_1$, $BL_2$. The column of MOSFETs may be coupled to the same bit line, where the bit line is connected to the drain of each MOSFET in the same column. The voltage difference between a bit line, $BL_1$, and a bit bar line, $BL_1$, may be measured by a voltage comparator to determine and/or output a data bit. The MOSFETS may be coupled to a source line, SL, where the source line is connected to the source of each MOSFET. A source line, SL, may be asserted depending on the configuration and operating principles of the MOSFET array 500.

In one or more embodiments, the modified MOSFETs 510 may have a higher charge trapping density in their gate dielectric layer, in comparison to the unmodified MOSFETs 515 in the same memory cell(s) 530. During programming, this can result in a change in the threshold voltage of MOSFET 510, while the unmodified MOSFET 515 is unchanged. The change difference in the threshold voltage allows for storage of a digital value (i.e., a bit, 1 or 0) in the memory cell 530. The trapped charge can be released by suitable reversals of the voltages resulting in the erasure of the digital value, thus preparing the memory cell 530 for future writing of digital values. The higher charge trapping density allows the modified MOSFETs to hold the digital value that can be determined by measurement of the threshold voltage of the modified MOSFETs. The unmodified floating gate transistors 515, 525 may be reference elements of the twin memory cell 530 that allows detection of the digital value on the modified MOSFET in the same twin memory cell 530. The modified transistor 510, due to its high trap density, may easily change its threshold when a programming voltage is applied.

The un-modified transistor, which is present in each memory cell 530, can provide a 'local' reference that enables easy detection of the change. Together the modified MOSFETs 510 and unmodified MOSFET 515 form a sensitive method to detect even small changes in the threshold voltage. The arrangement of the twin memory cell 530, where there are two transistors and the difference between the two voltages holds a digital value can be a compromise between device density and sensitivity. In various embodiments without a unmodified MOSFET 515 as a reference, the memory array could be a lot more dense (i.e., take up smaller area), but will not be as sensitive.

In one or more embodiments, a twin memory cell 530 may be electrically connected to a word line $WL_1$, $WL_2$. In various embodiments, a bit line $BL_1$, and a bit bar line $BL_1$, may be electrically connected to a voltage comparator to detect a difference in voltage between bit line $BL_1$ and a bit bar line $BL_1$. Bit line $BL_2$, and bit bar line $BL_2$ may be electrically connected to a voltage comparator to detect a difference in voltage.

In one or more embodiments, during operation the modified MOSFET 510, 520 may be charged by applying a voltage to the gate of the modified MOSFET, where the voltage causes the carrier traps to accumulate and store a charge. Because the modified MOSFET can accumulate a greater charge on the gate dielectric layer than the gate dielectric layer of an unmodified MOSFET, a change in the threshold voltage of the modified MOSFET can be maintained even when power is removed to the circuit. The stored charge may be released with the application of suitable reversed voltages, thus preparing the memory cell for future write events.

In various embodiments, a modified MOSFET may have a threshold voltage that is $V_t$ when the gate dielectric layer is in an uncharged state, and $V_t+\Delta V_t$ in a charged state. When a voltage, V, that is between $V_t$ and $V_t+\Delta V_t$ is applied to the gate of the modified MOSFET, a current will flow if the gate dielectric layer is uncharged because $V>V_t$ and a current will not flow if the gate dielectric layer is charged because $V<V_t+\Delta V_t$, when a suitable bias voltage is applied to the drain.

Figure 6:
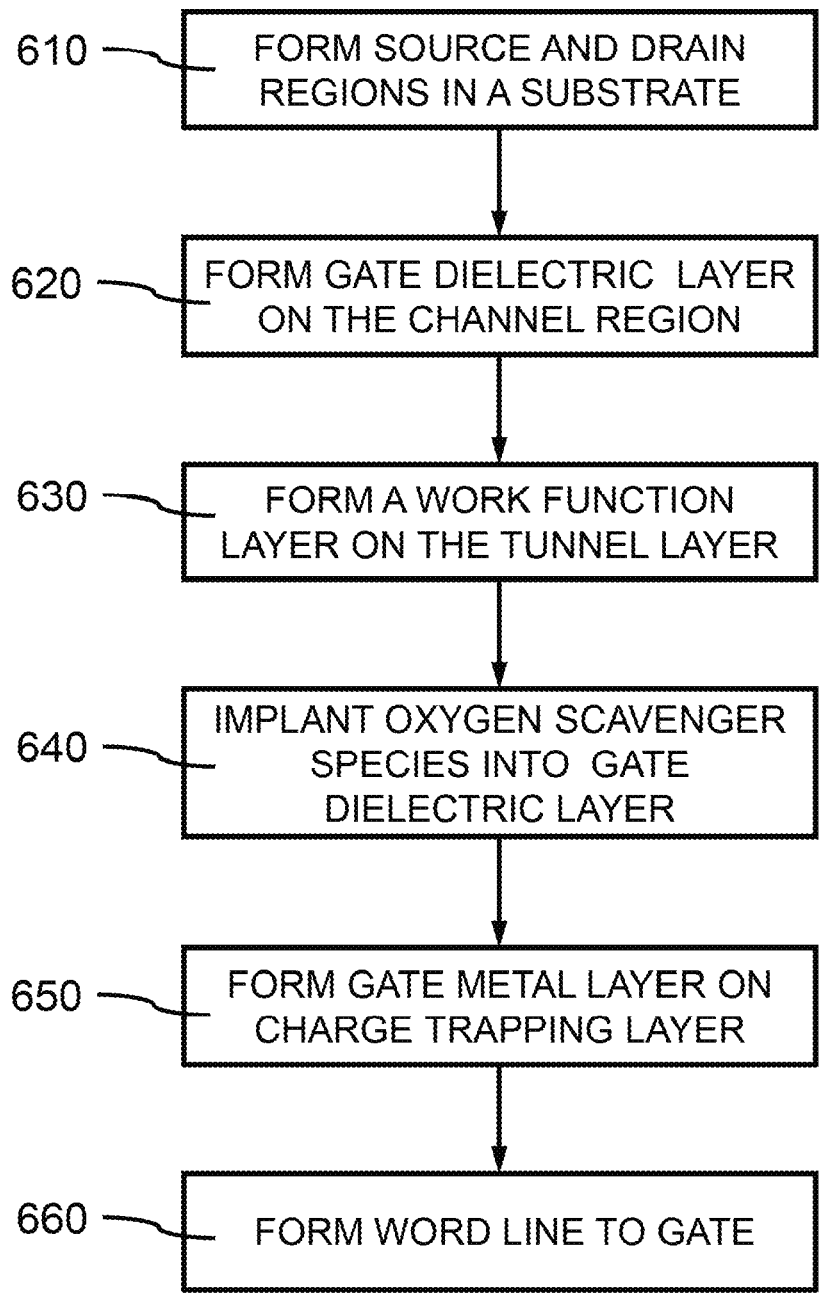
FIG. 6 is a block/flow diagram showing a process of fabricating a metal oxide semiconductor field effect transistors (MOSFET) having a modified gate dielectric layer according to an exemplary embodiment.

In one or more embodiments, the gate dielectric layer of the MOSFETs may have undergone ion implantation to increase the number of oxygen vacancies in the gate dielectric layer when the MOSFET memory array was being fabricated to form a modified MOSFET. One or more gate dielectric layers of the MOSFETs forming the MOSFET memory array 500 may be masked during the ion implantation process to maintain one or more gate dielectric layers in an unmodified state to fabricate unmodified MOSFETs 515, 525. One or more gate dielectric layers of the MOSFETs forming the MOSFET memory array 500 may be unmasked during the ion implantation process to form one or more gate dielectric layers in a modified state to fabricate modified MOSFETs 510, 520. In various embodiments, the unmodified MOSFETs 515, 525 may be NFETs or PFETs FIG. 6 is a block/flow diagram showing a process of fabricating a metal oxide semiconductor field effect transistors (MOSFET) having a modified gate dielectric layer according to an exemplary embodiment.

In block 610, doping species may be implanted into a substrate 110 to form source and drain regions of a field effect transistor (FET). A doped substrate 110 may form the channel region 120 between the implanted source region 160 and drain region 170. In various embodiments, the substrate may be a p-doped semiconductor or an n-doped semiconductor (e.g., Si, Ge, GaAs, SiGe, etc.).

In block 620, a gate dielectric layer 130 may be formed on the channel region 120 of the FET, where the gate dielectric layer 130 may extend laterally from the edge of the source region 160 to the edge of the drain region 170, so as to cover the channel region 120. The gate dielectric layer 130 may extend over the source region 160 and/or drain region 170. In various embodiments, the gate dielectric layer 130 may be an insulating oxide material, for example a high-k metal oxide. In an embodiment, the gate dielectric layer 130 may be hafnium dioxide ($HfO_2$).

In block 630, a work function layer 140 may be formed on the gate dielectric layer 130. In various embodiments, the work function layer 140 may be a conductive nitride or carbide. In an embodiment, the work function layer 140 may be titanium nitride (TiN).

In block 640, an oxygen scavenging species may be implanted into the gate dielectric layer 130 to form a modified gate dielectric layer 130 incorporating the oxygen scavenging species. The oxygen scavenging species may increase the oxygen vacancies in the gate dielectric layer 130. The oxygen scavenging species may be selected from the group consisting of aluminum, (Al), beryllium (Be), magnesium (Mg), calcium (Ca), strontium (Sr), barium (Ba), scandium (Sc), yttrium (Y), lanthanum (La), zirconium (Zr), hafnium (Hf), dysprosium (Dy), lutetium (Lu), erbium (Er), praseodymium (Pr), cesium (Ce), and combinations thereof.

In various embodiments, a work function layer 140 may be formed on the gate insulating layer before ion implantation, such that the oxygen scavenging species is implanted into the gate dielectric layer 130 through the work function layer.

In various embodiments, a work function layer may be formed on the gate dielectric layer 130, and the gate metal layer 150 may be formed on the work function layer 140 before ion implantation, such that the oxygen scavenging species is implanted into the gate dielectric layer 130 through the work function layer and the gate metal layer.

In block 650, a gate metal layer 150 may be formed on the work function layer 140 to form an electrical connection to the gate for back end of line connections. In various embodiments, the gate metal layer 150 may be a conductive material, for example, polycrystalline silicon, titanium nitride (TiN), a conductive metal (e.g., copper (Cu), tungsten (W), aluminum (Al), molybdenum (Mo), cobalt (Co), etc.), that may be deposited by chemical vapor deposition (CVD) or by electrochemical deposition.

In block 660, word lines, WL, may be formed to the gate stacks 180 of a plurality of MOSFETs to connect the gates of the MOSFETS into a memory array 500. Bit lines, BL and source lines, SL, may also be formed to the drains and source, respectively, of the MOSFETs.

The gate stack 180 may be a control gate of a MOSFET for controlling the charge on the gate dielectric layer 130. In various embodiments, gate stack 180 may be electrically connected to a word line, WL, and a suitable voltage applied to the gate to populate or discharge the carrier traps.

Having described preferred embodiments of an improved multi-time programmable memories using local implantation in high-k/metal gate technologies (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A process of fabricating a metal oxide semiconductor field effect transistor (MOSFET) having a modified gate dielectric layer, comprising:

forming an unmodified gate dielectric layer on a channel region in a substrate;

forming a work function layer on the unmodified gate dielectric layer; and implanting an oxygen scavenging species into the unmodified gate dielectric layer to increase the number of oxygen vacancies in the gate dielectric layer to form the modified gate dielectric layer.

2. The process of claim 1, wherein the modified gate dielectric layer is a high-k metal oxide.

3. The process of claim 2, wherein the high-k metal oxide is hafnium oxide.

4. The process of claim 1, wherein the oxygen scavenging species is selected from the group consisting of aluminum, (Al), beryllium (Be), magnesium (Mg), calcium (Ca), strontium (Sr), barium (Ba), scandium (Sc), yttrium (Y), lanthanum (La), zirconium (Zr), hafnium (Hf), dysprosium (Dy), lutetium (Lu), erbium (Er), praseodymium (Pr), cesium (Ce), and combinations thereof.

5. The process of claim 1, wherein the modified gate dielectric layer has a greater density of oxygen vacancies than the unmodified gate dielectric layer that provides an increase in threshold voltage.

6. The process of claim 1, further comprising forming a source region and a drain region in the substrate, wherein the channel region is between the source region and the drain region, and the modified gate dielectric layer is on the channel region.

7. The process of claim 6, wherein the work function layer is a conductive nitride.

8. The process of claim 6, further comprising forming a gate metal layer on the work function layer forming a gate stack, wherein the oxygen scavenging species is implanted into the gate dielectric layer through the gate metal layer and work function layer.

9. The process of claim 8, wherein the channel region, the source region, the drain region, the modified gate dielectric layer, the work function layer, and the gate metal layer forms an n-type metal oxide semiconductor field effect transistor (MOSFET) adjacent to an n-type or p-type MOSFET having an unmodified gate dielectric layer, where the n-type MOSFET and p-type MOSFET forms a complementary metal oxide semiconductor (CMOS) cell.

10. The process of claim 9, further comprising, forming a word line and a bit line to the CMOS cell.

11. The process of claim 9, wherein the modified gate dielectric layer is configured to have a first threshold voltage, Vt, and a second threshold voltage $V_t + \Delta V_t$.

12. A process of fabricating a metal oxide semiconductor field effect transistor (MOSFET) having a modified gate dielectric layer, comprising:
forming a source region, a drain region, and a channel region in a substrate;
forming a gate dielectric layer on the channel region;
forming a work function layer on the gate dielectric layer;
forming a gate metal layer on the work function layer; and
implanting an oxygen scavenging species into the gate dielectric layer to increase the number of oxygen vacancies in the gate dielectric layer.

13. The process of claim 12, wherein the gate dielectric layer is a high-k metal oxide layer, and the work function layer is a conductive nitride.

14. The process of claim 13, wherein the gate dielectric layer is hafnium oxide and the oxygen scavenging species is selected from the group consisting of aluminum, (Al), beryllium (Be), magnesium (Mg), calcium (Ca), strontium (Sr), barium (Ba), scandium (Sc), yttrium (Y), lanthanum (La), zirconium (Zr), hafnium (Hf), dysprosium (Dy), lutetium (Lu), erbium (Er), praseodymium (Pr), cesium (Ce), and combinations thereof.

15. A process of fabricating a plurality of metal oxide semiconductor field effect transistors (MOSFETs) having a modified gate dielectric layer, comprising:
forming a plurality of source regions, a plurality of drain regions, and a plurality of channel regions in a substrate;
forming a gate dielectric layer on each of the plurality of channel regions;
forming a work function layer on each of the gate dielectric layers;
forming a gate metal layer on each of the work function layers; and
implanting an oxygen scavenging species into a first subset of the gate dielectric layers to increase the number of oxygen vacancies in each of the gate dielectric layers.

16. The process of claim 15, wherein the oxygen scavenging species is selected from the group consisting of aluminum, (Al), beryllium (Be), magnesium (Mg), calcium (Ca), strontium (Sr), barium (Ba), scandium (Sc), yttrium (Y), lanthanum (La), zirconium (Zr), hafnium (Hf), dysprosium (Dy), lutetium (Lu), erbium (Er), praseodymium (Pr), cesium (Ce), and combinations thereof.

17. The process of claim 15, wherein the gate dielectric layers are hafnium oxide, and the gate metal layers are polycrystalline silicon.

18. The process of claim 15, wherein the oxygen scavenging species is implanted into the gate dielectric layers after forming the work function layers.

19. The process of claim 15, wherein the gate dielectric layers, work function layers, and gate metal layers form a gate stack on each of the plurality of channel regions, and wherein the gate stacks in a second subset are masked to prevent implantation of the oxygen scavenging species into the gate dielectric layer.

20. The process of claim 19, further comprising forming a word line to the gate metal layers.

* * * * *